US007929301B2

(12) United States Patent
Fong et al.

(10) Patent No.: US 7,929,301 B2
(45) Date of Patent: Apr. 19, 2011

(54) SPLASH RESISTANT POWER ADAPTER

(75) Inventors: Chee Kiong Fong, Cupertino, CA (US); Suet Fong Tin, Redmond, WA (US); J. David Egner, Sammamish, WA (US); Vinicio Manfrini, Sammamish, WA (US); Mike Hiett, Santa Clara, CA (US); Gary Tornquist, Sammamish, WA (US)

(73) Assignee: Microsoft Corporation, Redmond, WA (US)

(*) Notice: Subject to any disclaimer, the term of this patent is extended or adjusted under 35 U.S.C. 154(b) by 93 days.

(21) Appl. No.: 12/263,974

(22) Filed: Nov. 3, 2008

(65) Prior Publication Data

US 2010/0110631 A1    May 6, 2010

(51) Int. Cl.
*H05K 7/20* (2006.01)
(52) U.S. Cl. ... 361/695; 361/700; 361/719; 165/104.33; 454/184; 363/141
(58) Field of Classification Search ............... 361/689, 361/690, 695, 700, 704, 707, 719, 720, 688
See application file for complete search history.

(56) References Cited

U.S. PATENT DOCUMENTS

| | | | | |
|---|---|---|---|---|
| 4,547,438 A * | 10/1985 | McArthur et al. | ............... | 429/82 |
| 4,772,759 A | 9/1988 | Roy | | |
| 5,707,757 A * | 1/1998 | Lee | ................. | 429/86 |
| 6,643,130 B1 * | 11/2003 | DeMarchis et al. | .......... | 361/695 |
| 6,742,583 B2 * | 6/2004 | Tikka | ............................ | 165/291 |
| 7,289,320 B2 * | 10/2007 | Chang et al. | .................. | 361/690 |
| 2005/0007063 A1 | 1/2005 | Sekai | | |
| 2006/0104027 A1 * | 5/2006 | Vinson et al. | ................. | 361/695 |
| 2006/0198104 A1 | 9/2006 | Chang | | |
| 2006/0279928 A1 | 12/2006 | Lanni | | |
| 2007/0187128 A1 | 8/2007 | Sun | | |
| 2007/0279863 A1 * | 12/2007 | Illerhaus | ...................... | 361/695 |
| 2008/0101041 A1 | 5/2008 | Chang | | |

FOREIGN PATENT DOCUMENTS

EP        1701604 A1    9/2006

OTHER PUBLICATIONS

24w Water-Proof Power Adapter Manufacturer Exporting Direct from China, http://www.china-export-manufacturers.com, Downloaded from Internet Sep. 1, 2008, 2 pages.
60W Water-Proof Power Adapter-Electronics-in-China.com, http://www.electronics-in-china.com, Downloaded from Internet Sep. 1, 2008, 1 page.

* cited by examiner

*Primary Examiner* — Jayprakash N Gandhi
*Assistant Examiner* — Courtney Smith
(74) *Attorney, Agent, or Firm* — Woodcock Washburn LLP

(57) ABSTRACT

An external AC power adapter defines a power conversion chamber that retains power conversion circuitry operable to convert an input power to an output power. The power adapter further include an intake chamber and an outlet chamber, both having an aperture that places the respective chamber in fluid communication with the power conversion chamber. Each chamber may have at least one vent to the ambient environment such that an air mover is operable to circulate ambient air through the power conversion chamber. Each chamber may include a guard that deters liquid that has entered the respective chamber from flowing into the associated aperture.

12 Claims, 5 Drawing Sheets

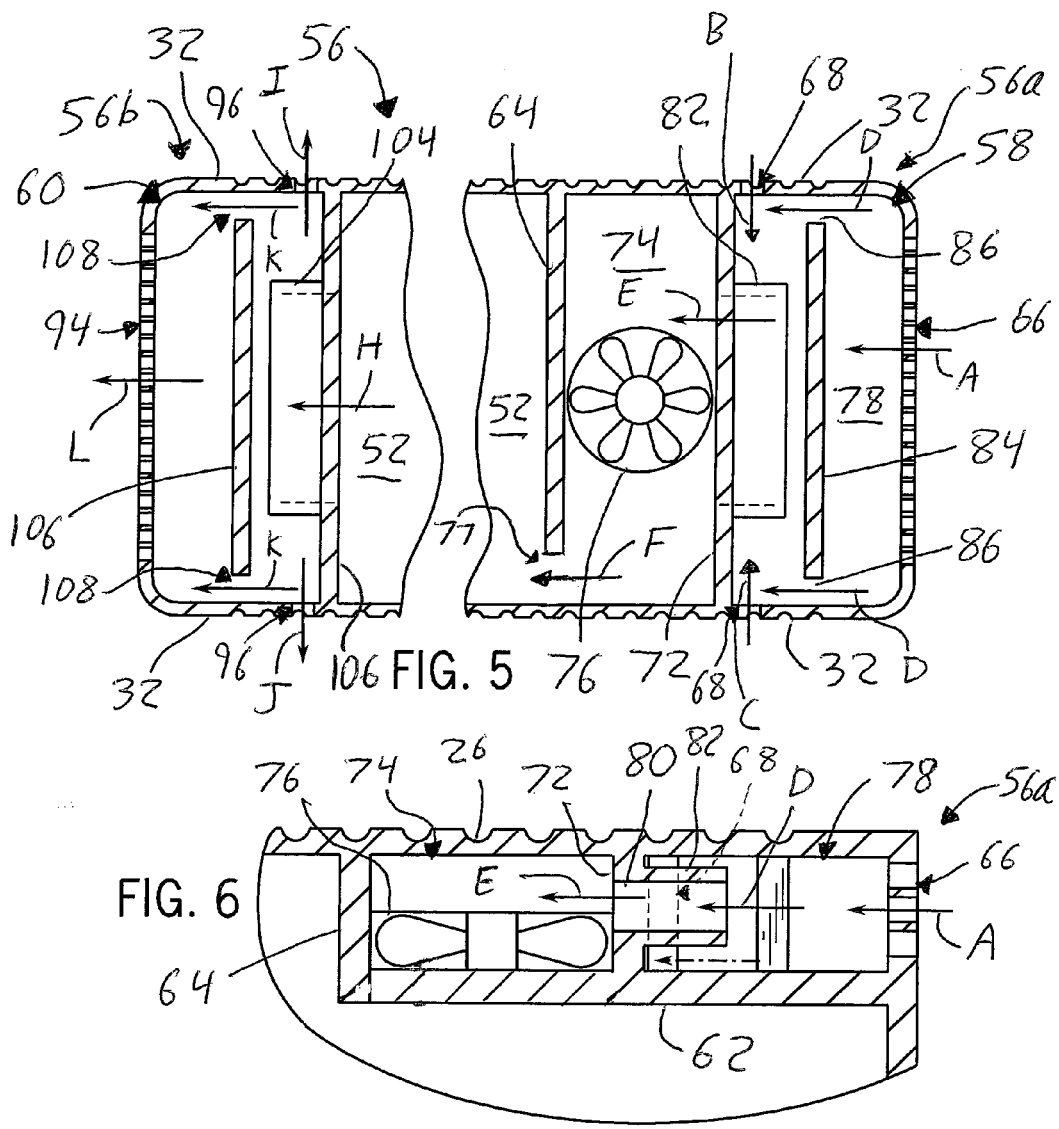
FIG. 5
FIG. 6
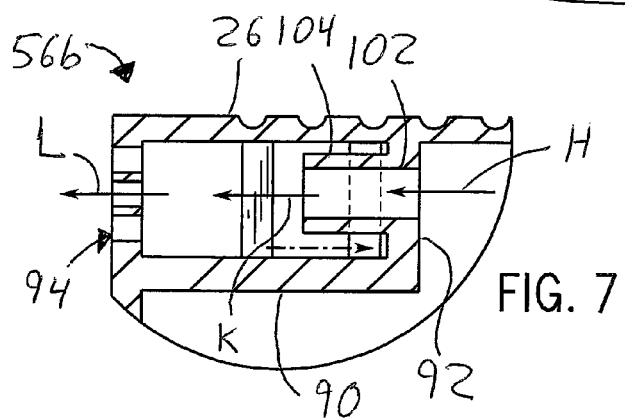
FIG. 7

SPLASH RESISTANT POWER ADAPTER

BACKGROUND

The present invention relates generally to the field of consumer electronics, and in particular relates to power adapters.

Many consumer products and other electrical devices employ power adapters for the purpose of converting a power input received from a power source into a power output suitable for use with the internal circuitry of the device. For instance, an AC adapter converts AC power input provided by an electrical receptacle into a DC power output. External AC power adapters provide several design advantages over AC power adapters that are internal to a device.

In certain instances, regulations require components that can be energized with AC power to be disposed in a secure housing so as to protect against inadvertent user contact with the energized component. In addition, a device can be made smaller and lighter when the size and weight of the AC power adapter, along with its housing or other safety features, are located outside of the device.

Conventional external AC power adapters have a "brick" configuration and can include a housing that contains power circuitry operable to receive AC power, convert the AC power to DC power, and output the DC power to the device. Such adapters are typically placed on the floor out of sight, for instance behind or under furniture, and are therefore often located in uncontrolled and unobserved environments.

In order to isolate the energized components from children, pets, and others who may unknowingly attempt to access such components, conventional AC adapters have housings that have no ventilation provided, thereby preventing inadvertent access to the interior components. Unfortunately, all power supplies, and therefore all external AC power adapters, generate some amount of interior heat.

An external AC power adapter having a sealed housing does not provide an efficient means for dissipating internal heat, thereby limiting the amount of power that can be economically delivered to a device without overheating the adapter. For example, plastic is usually the material used to construct an adapter housing due to its properties as a strong, low-cost electrical insulator having a favorable heat-rise allowance as dictated by applicable government agency standards. The sealed housing, however, causes the interior heat-generating components to diffuse their heat load through the housing into still air. Because plastic is a poor thermal conductor, and because still air results in poor thermal transfer, a conventional external AC power adapter is severely limited in the amount of power it can supply for a given adapter.

Accordingly, it has become desirable to provide external adapters having air ventilation capabilities. However, openings in the adapter housing that provide for air inputs and outlets also render the adapters susceptible to liquid ingress due to spills, splashes, and the like.

SUMMARY

An external AC power adapter that receives input power, converts the input power, and provides output power to a connected electronic device. The power adapter has a housing that defines a power conversion chamber. The power conversion chamber contains power circuitry that converts the input power to output power.

The housing may further define a ventilation intake chamber that includes a wall defining an intake aperture that places the intake chamber in fluid communication with the power conversion chamber. The intake chamber may further include a guard that extends from the wall and surrounds the intake aperture at a location spaced from the housing such that air can flow from the intake chamber into the power conversion chamber. At the same time, the guard prevents liquid disposed within the intake chamber from entering the aperture and eventually flowing into the power conversion chamber. An intake vent may extend through the housing at a location that places the intake chamber in fluid communication with the ambient environment. A divider wall may be disposed at a location such that the intake aperture is disposed between the divider wall and the power conversion chamber. The divider wall defines at least one gap that places the intake aperture in fluid communication with the intake vent such that air can flow from the intake vent and into the power conversion chamber.

The housing may further define a ventilation outlet chamber that includes a wall defining an outlet aperture that places the power conversion chamber in fluid communication with the outlet chamber. The outlet chamber may further include a guard that extends from the wall and surrounds the outlet aperture at a location spaced from the housing such that air can flow from the power conversion chamber into the outlet chamber. At the same time, the guard prevents liquid disposed within the outlet chamber from entering the outlet aperture and eventually flowing into the power conversion chamber. An outlet vent may extend through the housing at a location that places the outlet chamber in fluid communication with the ambient environment. A divider wall may be disposed at a location such that the outlet aperture is disposed between the divider wall and the power conversion chamber. The divider wall may define at least one gap that places the outlet aperture in fluid communication with the outlet vent such that air can flow from the power conversion chamber to the outlet vent.

The power adapter may also include an air mover that draws ambient air into the intake chamber via the intake vent, circulates the ambient air through the power conversion chamber, and causes the ambient air to flow into the outlet chamber and exit the housing via the outlet vent.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 5 is a sectional top plan view of the air intake end and the air outlet end illustrated in FIG. 1, taken along line 5-5 of FIG. 1;

FIG. 6 is a sectional side elevation view of the air intake end illustrated in FIG. 1, taken along line 6-6 of FIG. 1; and FIG. 7 is a sectional side elevation view of the air outlet end illustrated in FIG. 1, taken along line 7-7 of FIG. 1.

DETAILED DESCRIPTION

Figure 1:
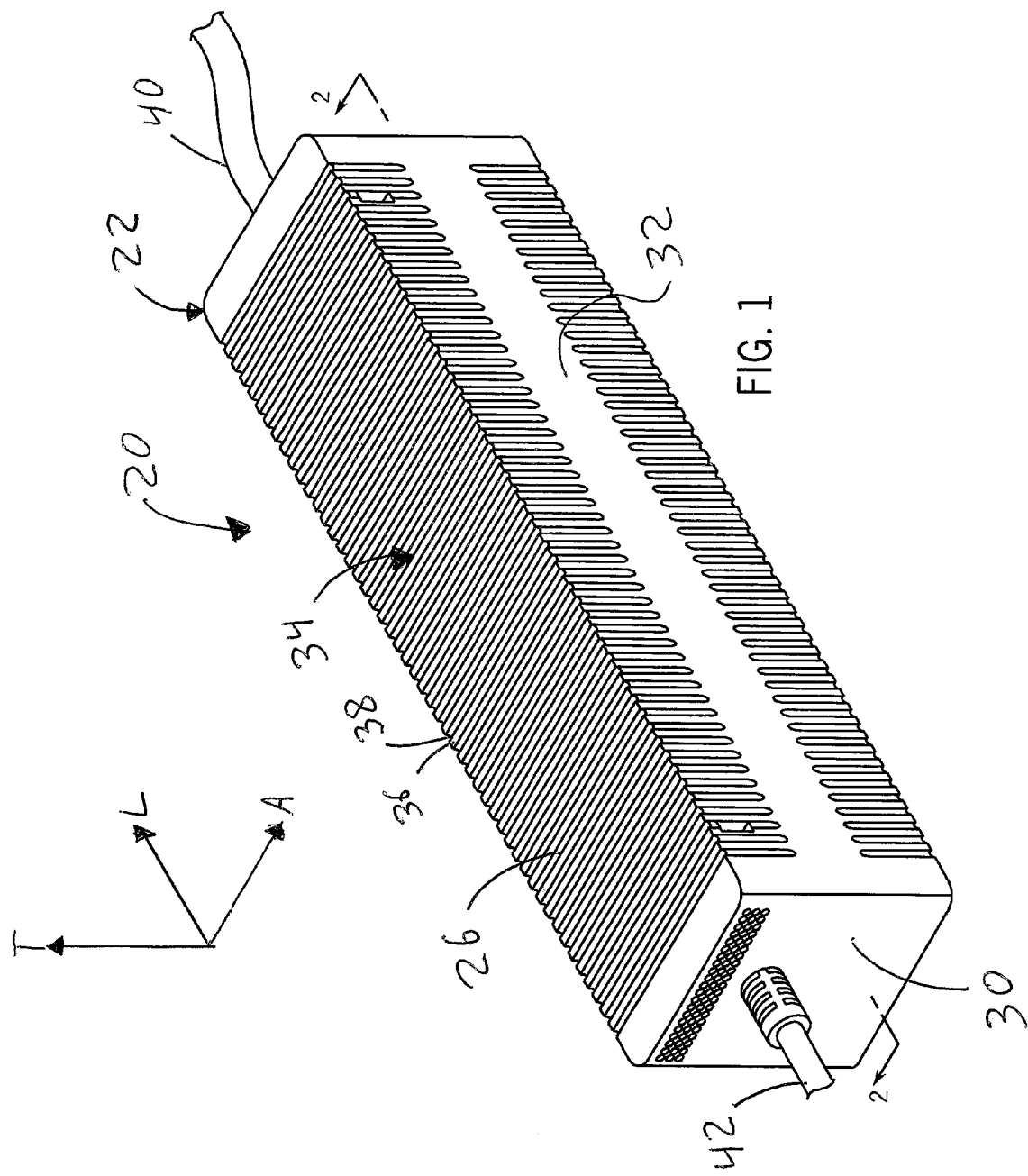
FIG. 1 is a perspective view illustrating one embodiment of an external AC power adapter having an air intake end and an air outlet end.

Referring to FIG. 1, an electrical component is illustrated as a power adapter 20. While the power adapter 20 is shown as an external AC power adapter, it should be appreciated, unless otherwise specified, that the adapter 20 is not limited to such a construction. For instance, the power adapter could be internal to an electronic device, and it is not intended that it be limited to an AC adapter. Rather, any electrical component that can benefit from splash-resistant ventilation is contemplated herein.

Figure 2:
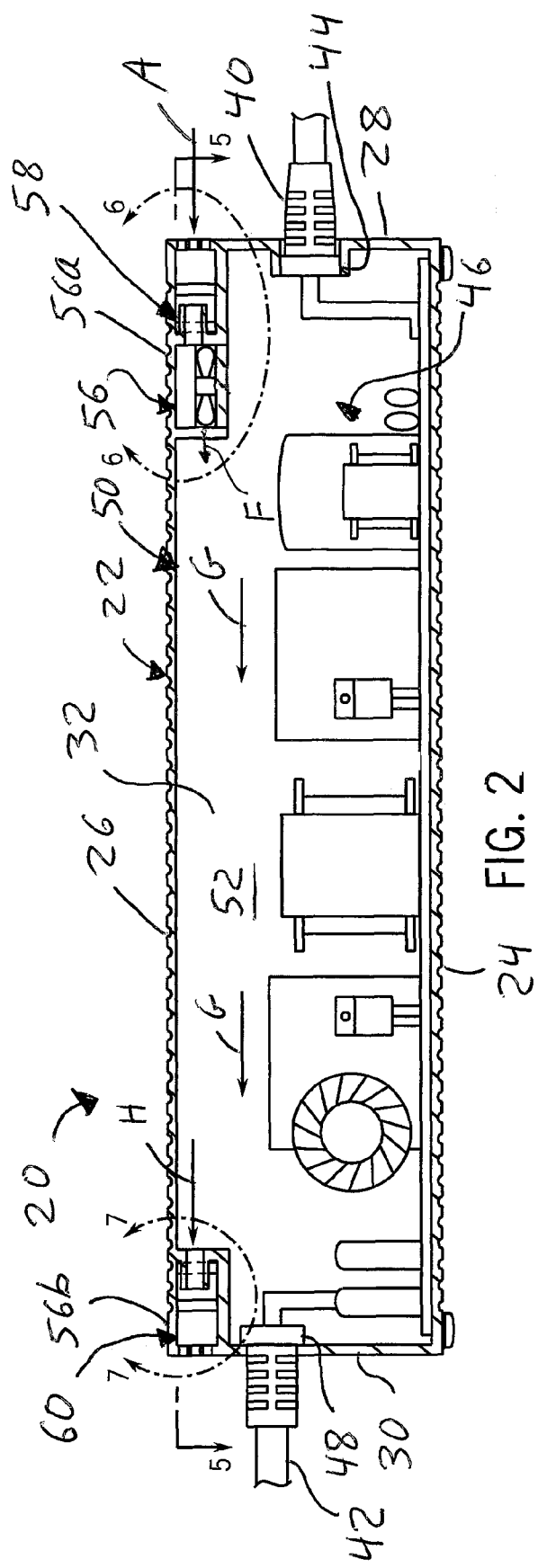
FIG. 2 is a sectional side elevation view of the external AC power illustrated in FIG. 1, and taken along line 2-2 of FIG. 1.

Referring to FIGS. 1 and 2, one embodiment of a power adapter 20 includes a housing 22 that may be formed from plastic due to its physical strength and low cost, though any suitable alternative material can be used. The housing 22 includes a base 24, a cover 26, first and second end walls 28 and 30 extending between the longitudinally outer ends of the base 24 and cover 26, and a pair of opposing side walls 32 (see also FIG. 5) extending between the laterally outer ends of the end walls 28 and 30, the base 24, and the cover 26. The base 24, cover 26, end walls 28 and 30, and side walls 32 can be integrally formed or otherwise mechanically connected.

In the present embodiment, the housing 22 defines an exterior 34 that may include any gripping or aesthetic features as desired, and may include parallel ribs 36 and slots 38 for improved gripping as illustrated. The housing 22 may be disposed between a power input wire 40 and a power output wire 42. As shown in FIG. 2, the input wire 40 may extend from a housing inlet 44 and receive power input from a power source, for example a wall receptacle (not shown). The power travels through internal electronic power circuitry, collectively identified as 46, that converts the input power, and outputs the converted power to the power output wire 42 that extends from a housing outlet 48 to an electrical device to which the converted power may be is supplied. In the illustrated embodiment, the power converter 20 receives an AC input by way of wire 40, and converts the AC input to a DC output that has characteristics (e.g., 12V, etc.) that are suitable for a device to which power is being supplied (not shown in the Figures for clarity). The DC output is transmitted to a device by way of wire 42. It will be appreciated that an embodiment is equally applicable for use in connection with any type of electrical device that requires an external AC power adapter.

As further illustrated, the adapter housing 22 may be generally rectangular in shape, and may extend horizontally along a longitudinal direction "L" and lateral direction "A", and vertically along a transverse direction "T". The housing 22, and in particular the base 24, cover 26, and side walls 32, may be elongate in the longitudinal direction L. Unless otherwise specified herein, the terms "lateral," "longitudinal," and "transverse" as used to describe the orthogonal directional components of the adapter housing 22 are likewise used to describe the directional components of the remainder of the components of the power adapter 20. The terms "inboard" and "inner," and "outboard" and "outer" are used with respect to a specified directional component to identify directions along the directional component toward and away from the center of the power adapter 20.

It should be appreciated that while the longitudinal and lateral directions are illustrated as extending along a horizontal plane, and that the transverse direction is illustrated as extending along a vertical plane, the planes that encompass the various directions may differ during use, depending, for instance, on the orientation of the power adapter 20 during use. Accordingly, the terms "vertical" and "horizontal" are used to describe the power adapter 20 in the orientation illustrated in FIGS. 1 and 2 merely for the purposes of clarity and convenience, it being appreciated that the actual orientations may change during use.

Referring now to FIG. 2, the adapter housing 22 may define an internal chamber 50 that includes a power conversion chamber 52 that houses the various electrical power conversion components 46 that receive power from the power input wire 40 and output converted power to the power output wire 42. The internal chamber 50 may further include a ventilation system 56 that includes an air intake end 56a and an air outlet end that both include air movement chambers. For instance, the air intake end 56a may include a ventilation intake chamber 58, and the air outlet end 56b may include a ventilation outlet chamber 60. The ventilation chambers 58 and 60 may allow air to pass through the power conversion chamber 52 while isolating liquid that spills into either chamber 58 or 60 with respect to the power conversion chamber 52. The terms "upstream" and "downstream" are used with respect to the direction of airflow through the housing 22.

Figure 3:
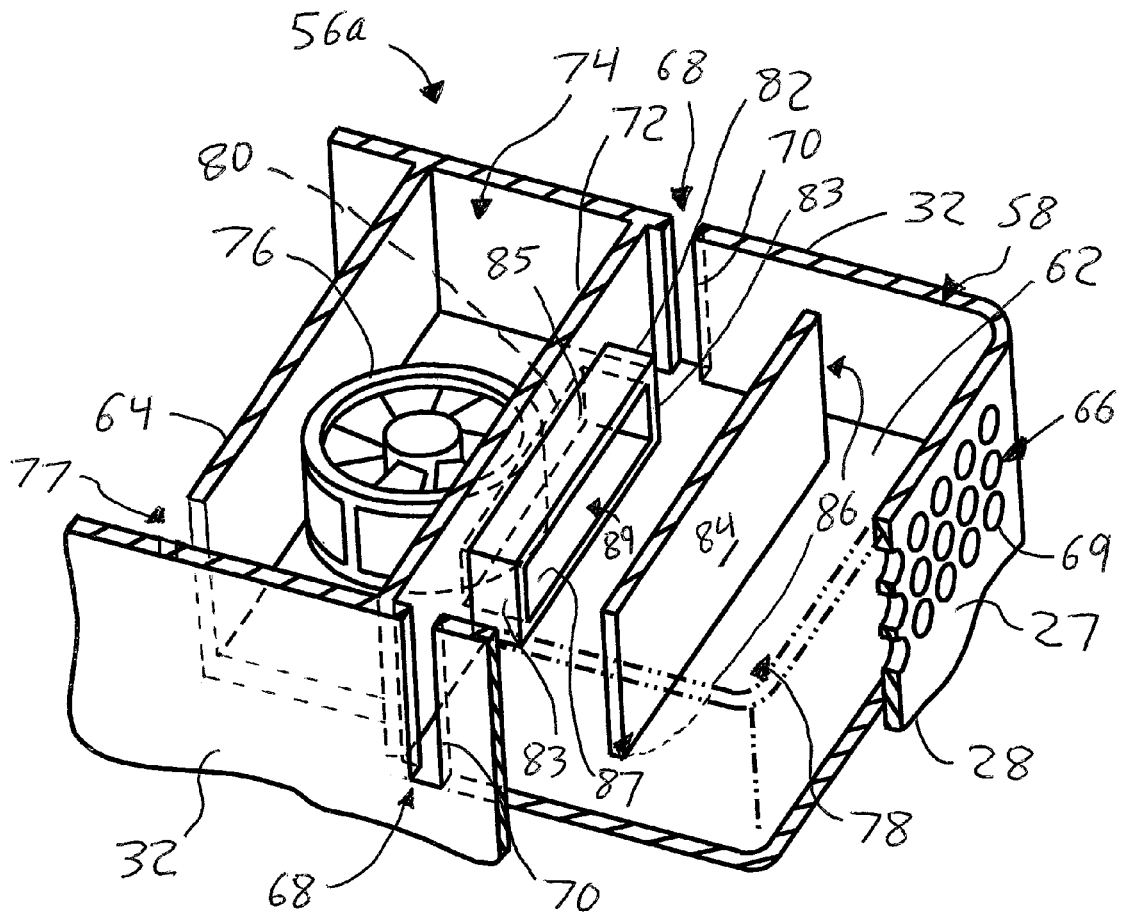
FIG. 3 is a perspective view of a portion of the air intake end illustrated in FIG. 1.

Referring now also to FIG. 3, the ventilation intake chamber 58 may be defined at its longitudinally outer ends by an upper portion 27 of the first end wall 28 that extends between the chamber base 62 and the cover 26, and a vertical partition 64. A base 62 and a portion of the cover 26 that extends between the end wall 28 and the partition 64 define the upper and lower boundaries of the chamber 58, and a portion of the opposing side walls 32 that extends between the cover 26 and the base 62 define the lateral boundaries of the chamber 58. A divider wall 72 may be disposed inside the ventilation intake chamber 58. The partition 64 can terminate laterally short of one or both of the side walls 32 to define a gap, identified as aperture 77, extending between the side wall(s) 32 and the partition wall 64. The divider wall 72 may extend laterally from one side wall 32 to the other side wall, and may extend vertically from the chamber base 62 to the cover 26. The divider wall 72 may thus separate the chamber 58 into a fan compartment 74 that retains an air mover, or fan 76, and an air intake compartment 78.

The air intake end 56a may further include primary and auxiliary vents 66 and 68, respectively, that place the intake chamber 58 in fluid communication with the ambient environment that surrounds the power adapter 20. In particular, the primary vent 66 may be provided as a series of apertures 69 that extend longitudinally through the upper portion 27 of end wall 28. As shown in FIG. 3, the vent 66 may be arranged as a plurality of circular apertures arranged in rows that extend laterally between the side walls 32. It should be appreciated, however, that the vent 66 may be provided as one or more apertures in any desired shape and/or configuration that enables air to pass between the ambient environment and the intake compartment 78.

The auxiliary vents 68 may be provided as apertures 70 extending laterally through an upper portion 27 of each of the side walls 32 that extends between the chamber base 62 and the cover 26. The vents 68 may be located upstream of the divider wall 72. Accordingly, each auxiliary vent 68 may be in vertical alignment with the primary vent 66, and with the intake compartment 78. As shown in FIG. 3, each of the auxiliary vents 68 may be arranged as a vertically elongate slot extending through the side walls 32. It should be appreciated, however, that the auxiliary vents 68 may be provided as one or more apertures in any desired shape and/or configuration that enables air to pass between the ambient environment and the intake compartment 78. It should be further appreciated that the air intake end 56a may include additional vents or fewer vents extending between the ambient environment and the intake compartment 78 as desired so long as air may pass through the power conversion chamber 52 while spilled liquid is deterred from entering the power conversion chamber 52.

Referring now to FIGS. 3 and 6, the divider wall 72 may define an aperture 80 extending longitudinally through the divider wall that provides a passageway for air to flow between the intake compartment 78 and the fan compartment 74. The aperture 80 may be rectangular and laterally elongate as illustrated, however it should be appreciated that the aperture 80 may assume any suitable alternative size and shape. The lower end of the aperture 80 may be located on the divider wall 72 at a location that is spaced above the base 62, and the upper end of the aperture may be located on the divider wall at a location that is spaced below the cover 26. Accordingly, liquid that has entered the intake compartment 78 through either vent 66 or 68 is unable to flow freely along the cover 26 or base 62 and into the aperture 80. The outer lateral ends of the aperture 80 are located on the divider wall 72 at a location that is spaced laterally inward from the side walls 32.

The ventilation system 56 may further include a guard in the form of a flange 82 that extends from the surface of the divider wall 72 that faces the intake compartment 78. The flange 82 extends longitudinally into the intake compartment 78, and surrounds the perimeter of the aperture 80. The flange 82 includes a pair of opposing vertical side walls 83 connected between the outer lateral ends of upper and lower walls 85 and 87, respectively. The lower lateral wall 87 is disposed above the chamber base 62, the upper lateral wall 85 is disposed below the cover 26, and the side walls 83 of the flange 82 are spaced laterally inward with respect to the side walls 32 of the housing 22. The flange 82 thus defines an opening 89 that is in alignment with aperture 80.

It should be appreciated that the upper and lower walls 85 and 87 may guard against the ingress of liquid that has entered the intake compartment 78 into the fan compartment 74 and subsequently into the power conversion chamber 52 (for instance, when the power adapter 20 is in an orientation that is angled with respect to the horizontal). The side walls 83 extend from the divider wall 72 a sufficient longitudinal distance such that the walls 83 overlap the auxiliary vents 68 with respect to the lateral direction. As a result, the side walls 83 guard against the ingress of liquid that has entered the intake compartment 78 via vents 68 into the fan compartment 74 and subsequently into the power conversion chamber 52.

The flange 82 is illustrated as having a rectangular shape, though it should be appreciated that the size and shape of the flange 82 could vary as desired. Furthermore, while the flange 82 is illustrated as corresponding to the size and shape of the outer edges of the aperture 80, the size and shape of the flange may differ from that of the outer edges of the aperture 80. Moreover, while the flange 82 shields all sides of the aperture 80 from ingress of splashed liquids, the flange 82 may alternatively surround only a portion of the aperture 80.

The ventilation system 56 may further include a guard plate 84 disposed in the intake compartment 78. The guard plate 84 extends vertically from the chamber base 62 to the cover 26, and extends laterally between the side walls 32. In one embodiment, the guard plate 84 is laterally elongate but terminates at a location laterally inward from the side walls 32 such that gaps 86 extend between the outer lateral ends of the guard plate 84 and the side walls 32. The gaps 86 may permit air to flow from the primary vent 66 to the fan compartment 74 via aperture 80. It should be appreciated that the guard plate 84 may extend to one of the side walls 32 such that the gap 86 is disposed between the guard plate 84 and only one of the side walls 32. It should be further appreciated that the guard plate 84 may extend to both side walls 32, and the gap may extend through the guard plate 84. In this regard, it should be appreciated that the guard plate 84 may define at least one gap that places the primary vent 66 in fluid communication with the aperture 80.

In the illustrated embodiment, the outer lateral ends of the guard plate 84 are disposed at a lateral location laterally outboard of the vertical side walls of the flange 82, and laterally inboard of the housing side walls 32. Furthermore, the outer lateral ends of the guard plate 84 extend laterally outboard of the primary vent 66. Accordingly, the guard plate 84 may block liquid entering the primary vent from flowing directly into the aperture 80. The guard plate 84 thus may guard the aperture 80 with respect to liquid that enters the primary vent 66.

Referring again to FIG. 3, the fan 76 may be disposed in the fan compartment 74 to provide forced air cooling of the electrical components 46 disposed in the power conversion chamber 52. The fan 76 may be any type of air-moving device including, but not limited to, bladed fans, centrifugal blowers, and the like. The fan 76 may receive power (e.g., 12V) from the DC output of power adapter 20 or the AC input to the power adapter 20, though the DC output is preferred. The fan 76 may further be provided with control circuitry that is configured to effect a shutoff of the power adapter 20 in the event of a short-circuit, contact with liquid, starvation of airflow due to obstruction of the vents 66 and 68, or the like.

The fan 76 may be mounted vertically within the fan compartment 74 at a location adjacent the divider wall 72. The fan 76 may have an intake end that is disposed below, or is otherwise in fluid communication with, the aperture 80 extending through the divider wall 72. The fan 76 may have an outlet that is in alignment with an aperture 77 (see also FIG. 5) extending through the vertical partition 64. The fan 76 may thus be in fluid communication with the power conversion chamber 52 and operable to draw ambient air into the intake chamber 58 from the ambient environment, through vents 66 and 68, and force the ambient air into the power conversion chamber 52, and out the converter housing 22 via the outlet chamber 60.

The air outlet end 56b will now be described with reference to FIGS. 4 and 5. As illustrated, the ventilation outlet chamber 60 may be defined at its longitudinally outer ends by the upper portion 27 of the second end wall 30 and a vertical partition wall 92. A base 90 and a portion of the cover 26 that extends between the end wall 30 and the partition 92 may define the upper and lower boundaries of the chamber 60, and a portion of the opposing side walls 32 that extends between the cover 26 and the base 90 may define the lateral boundaries of the chamber 60. The partition wall 92 extends laterally from one side wall 32 to the other side wall 32, and extends vertically from the chamber base 90 to the cover 26. The partition wall 92 may thus separate the ventilation outlet chamber 60 from the power conversion chamber 52.

The air outlet end 56b may further include primary and auxiliary vents 94 and 96, respectively, that place the outlet chamber 60 in fluid communication with the ambient environment surrounding the power adapter 20. In particular, the primary vent 94 may be provided as a series of apertures 98 that extend longitudinally through an upper portion 29 of the end wall 30 that extends between the chamber base 90 and the cover 26. The vent 94 may be arranged as a plurality of circular apertures arranged in rows that extend laterally between the side walls 32. It should be appreciated, however, that the vent 94 may be provided as one or more apertures in any desired shape and/or configuration that enables air to pass between the ambient environment and the outlet chamber 60.

The auxiliary vents 96 may provided apertures 100 extending laterally through an upper portion 29 of each of the side walls 32 that extends between the chamber base 90 and the cover 26. The vents 96 may be located downstream of the wall partition 92. Accordingly, each auxiliary vent 96 may be in vertical alignment with the primary vent 94, and with the outlet chamber 60. As shown in FIG. 4, each of the auxiliary vents 96 may be arranged as a vertically elongate slot extending through the side walls 32. It should be appreciated, however, that the auxiliary vents 96 may be provided as one or more apertures in any desired shape and/or configuration that enables air to pass between the ambient environment and the outlet chamber 60. It should be further appreciated that the air outlet end 56b may include additional vents or fewer vents extending between the ambient environment and the outlet chamber 60 as desired so long as air may pass through the power conversion chamber 52 while spilled liquid is deterred from entering the power conversion chamber.

Figure 4:
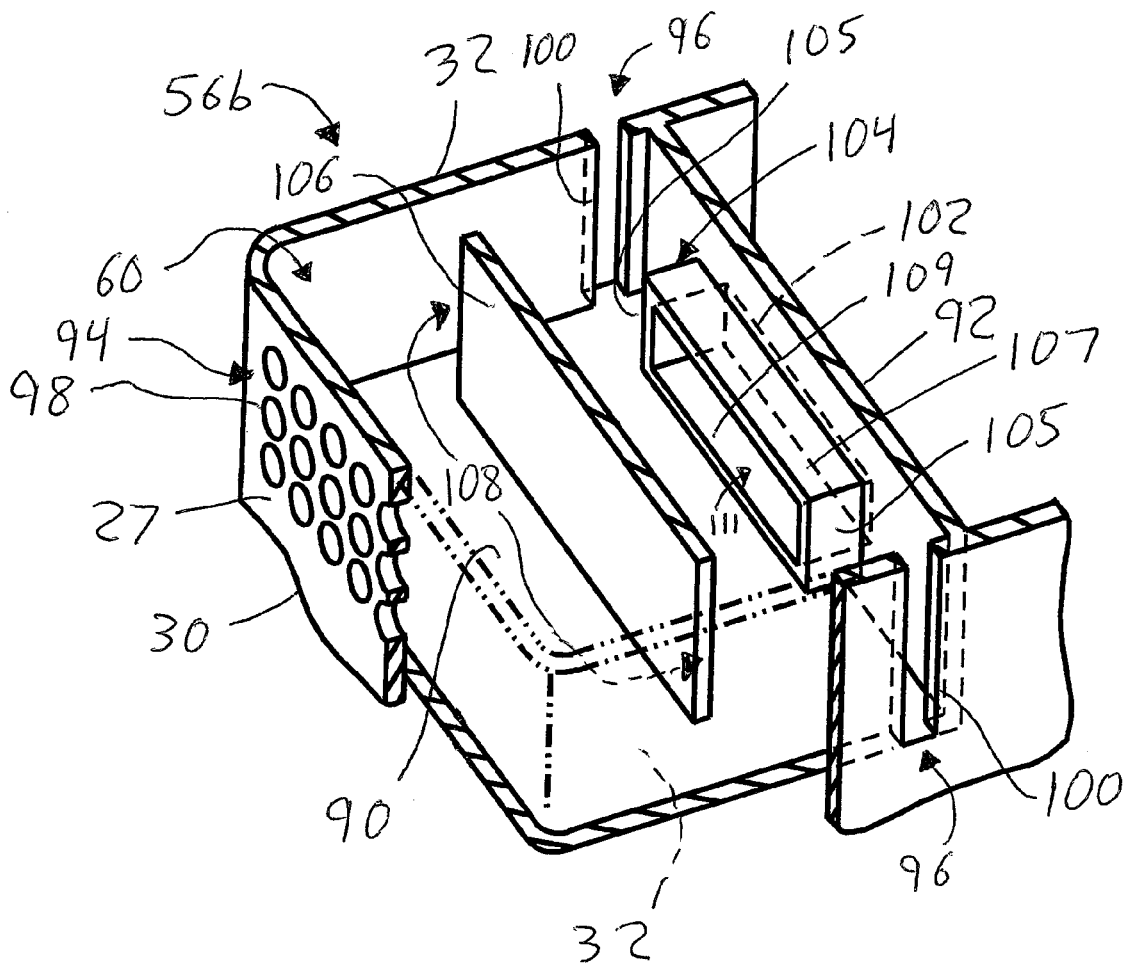
FIG. 4 is perspective view of a portion of the air outlet end illustrated in FIG. 1.

With continuing reference to FIGS. 4, 5, and 7, the partition wall 92 may define an aperture 102 extending longitudinally through the partition wall that places the outlet chamber 60 in fluid communication with the power conversion chamber 52. The aperture 52 may thus provide a passageway for air to flow between the power conversion chamber 52 and the outlet chamber 60. In the figures, the aperture 102 is illustrated as being shaped and positioned as described with reference to aperture 80, however aperture 102 may extend longitudinally downstream from the partition wall 92. Accordingly, the lower end of the aperture 102 may be located on the partition wall 92 at a location that is spaced above the base 90, and the upper end of the aperture 102 may be located on the partition wall at a location that is spaced below the cover 26. Accordingly, liquid that has entered the outlet chamber 60 through either vent 94 or 96 may be unable to flow freely along the cover 26 or base 90 and into the aperture 102. The outer lateral ends of the aperture 102 may be located on the partition wall 92 at a location that is spaced laterally inward from the side walls 32. It should be appreciated, of course, that the aperture 102 may be sized and shaped differently with respect to aperture 80 if desired.

The air outlet end 56b may further include a guard in the form of a flange 104 that extends from the surface of the partition wall 92 that faces the interior of the outlet chamber 60. The flange 104 may be constructed as described above with reference to flange 82, and therefore may include a pair of opposing vertical side walls 105 connected between the outer lateral ends of upper and lower walls 107 and 109, respectively. The lower lateral wall 109 is disposed above the chamber base 90, the upper lateral wall 107 is disposed below the cover 26, and the side walls 105 of the flange 104 are disposed laterally inward with respect to the side walls 32 of the housing 22. The flange 104 thus defines an opening 111 that is in alignment with aperture 102.

It should be appreciated that the upper and lower walls 107 and 109 may guard against the ingress of liquid that has entered the outlet chamber 60 into the power conversion chamber 52 (for instance, when the power adapter 20 is in an orientation that is angled with respect to the horizontal). The side walls 105 may extend from the partition wall 92 a sufficient longitudinal distance such that the walls 105 overlap the auxiliary vents 96 with respect to the lateral direction. As a result, the side walls 105 may guard against the ingress of liquid that has entered the outlet chamber 60 via vents 96 into the power conversion chamber 52.

In the embodiment shown, the flange 104 is illustrated as having a rectangular shape, though it should be appreciated that the size and shape of the flange 104 may vary as desired. Furthermore, while the flange 104 is illustrated as corresponding to the size and shape of the outer edges of the aperture 102, the size and shape of the flange may differ from that of the outer edges of the aperture 102. Moreover, while the flange 104 may shield all sides of the aperture 102 from ingress of splashed liquids, the flange 104 may alternatively surround only a portion of the aperture 102.

The air outlet end 56b may further include a guard plate 106 disposed in the outlet chamber 60. The guard plate 106 may extend vertically from the chamber base 90 to the cover 26, and may extend laterally between the side walls 32. The guard plate 106 may be laterally elongate but may terminate at a location laterally inward from the side walls 32 such that gaps 108 may extend between the outer lateral outer ends of the guard plate 106 and the side walls 32. The gaps 108 may permit air to flow from the power conversion chamber 52 and out the outlet chamber 60 via vents 94 and 96. It should be appreciated that the guard plate 106 may extend to one of the side walls 32 such that a gap 108 is disposed between the guard plate 106 and only one of the side walls 32. It should be further appreciated that the guard plate 106 may extend to both side walls 32, and the gap may extend through the guard plate 106. In this regard, it should be appreciated that the guard plate 106 may define at least one gap that places the primary vent 94 in fluid communication with the aperture 102.

In the illustrated embodiment, the outer lateral ends of the guard plate 106 are disposed at a lateral location laterally outboard of the vertical side walls of the flange 104 and laterally inboard of the housing side walls 32. Furthermore, the outer lateral ends of the guard plate 106 may extend laterally outboard of the primary vent 94. Accordingly, the guard plate 106 may block liquid entering the primary vent from flowing directly into the aperture 102. The guard plate 106 thus may guard the aperture 102 with respect to liquid that enters the primary vent 94.

Operation of the power adapter 20 will now be described with reference to FIG. 5-7. In particular, operation of the fan 76 draws ambient air into the air intake compartment 78 through the primary vent 66 along the direction of Arrow A, and through the secondary vents 68 along the direction of Arrows B and C. Air flowing in from the primary vent 66 is directed laterally around the divider wall 72 and through the gaps 86 along the direction of Arrow D. The inclusion of multiple vents may increase the likelihood of adequate airflow into the intake compartment 78 even when one or more surfaces of the housing 22 abuts a wall, furniture, or other external surfaces that may impede airflow through one or more of the vents.

The air flows from the intake compartment 78, through the opening 89 of the flange 82, through aperture 80, and into the fan compartment 74 along the direction of Arrow E. The fan 76 can be provided as a blower that receives air from the intake chamber 58 and forces the air into the power conversion chamber 52 via aperture 77 along the direction of Arrow F, thereby inducing a positive pressure in the power conversion chamber. Accordingly, air in the power conversion chamber 52 may flow past the power conversion circuitry 46 in the direction of Arrow G (see also FIG. 2) and may facilitate forced air-cooling of the circuitry 46 by way of thermal convection. Alternatively, the fan 76 could be provided as an axial fan that blows air through an aperture extending through the base 62. If desired, baffle plates may be positioned in the power conversion chamber 52 that direct air down into the power conversion circuitry 46. The air may then flow through the aperture 102 and the opening 111 of flange 104 along the direction of Arrow H into the outlet chamber 60. A portion of the air entering the outlet chamber 60 may flow out the auxiliary vents 96 along the direction of Arrows I and J, and a portion of the air entering the outlet chamber 60 may flow laterally around the divider plate 106 along the direction of Arrow K, and out the primary vent 94 along the direction of Arrow L.

While the fan 76 is illustrated as being disposed in a fan compartment that is disposed within the intake chamber 58 and adjacent the intake compartment 78, it should be appreciated that any air movement system capable of circulating air across the power conversion circuitry 46 is contemplated. For instance, while the fan 76 draws air in through the vents 66 and 68, it should be appreciated that the fan 76 may alternatively expel air through the vents 66 and 68, thus creating a negative pressure within the power conversion chamber 52 that causes air to be drawn from the opposing vents 94 and 96. In this regard, the fan 76 may be disposed in alternative locations such as the power conversion chamber 52, or in the outlet chamber 60. If the fan is located outside the inlet chamber 58, then the divider wall 72 may define one longitudinal boundary of the inlet chamber 58, and the aperture 80 may place the interior of the inlet chamber 58 in direct fluid communication with the power conversion chamber 52. Alternatively still, the power adapter 20 may not include a fan, and the conversion chamber 52 could be cooled via passive ventilation.

As will now be described with reference to FIG. 5, the intake chamber 58 and outlet chamber 60 may provide forced cooling of the power conversion circuitry 46 and further inhibit water that has entered either chamber from flowing into the power conversion chamber 52, regardless of the orientation of the power adapter 20.

In particular, if liquid enters the intake chamber 58 via either the primary vent 66 or secondary vents 68, the liquid should flow into the intake compartment 78. Liquid entering the primary vent 66 may, under gravitational forces, either flow back out the primary vent 66, remain upstream of the divider wall 84, or flow downstream of the divider wall 84 through the gaps 86. Likewise, liquid entering through the secondary vents 68, under gravitational forces, can flow back out the vents 68, flow upstream of the divider wall 84, or remain downstream of the divider wall 84. Liquid that flows back out the vent or that is disposed upstream of the divider wall 84 should not flow into the fan compartment 74 and subsequently into the power conversion chamber 52.

Liquid that is disposed downstream of the divider wall 84 likewise should be deterred from flowing into the fan compartment 74 and subsequently into the power conversion chamber 52. In particular, liquid that flows along the base 62 (or the cover 26 or side walls 32, depending on the orientation of the housing 22) should be deterred from flowing freely into the opening 89 of the flange 82 due to the spacing of the flange walls with respect to the base 62, cover 26, and side walls 32. Accordingly, the liquid should flow to a location between the flange 82 and the proximal housing surface. The flange 82 may also prevent liquid that is flowing along the upstream surface of the divider wall 72 from flowing into the aperture 80. The liquid should therefore either remain in the intake cavity 78 or eventually exit the intake chamber 58 via one or more of the vents 66 and 68. It should be further appreciated that the outer surfaces of the flange 82, along with the guard plate 84, may provide a splashguard that prevents liquid splashing within the intake cavity 72 from entering the fan cavity 74. In particular, the flange side walls 83 guard the lateral ends of the opening 80, the upper and lower flange walls 85 and 87 may guard the upper and lower ends of the opening 80, and the guard plate 84 may guard the front of the opening 80 regardless of the orientation of the power adapter 20.

Likewise, if liquid enters the outlet chamber 60 via either the primary vent 94 or secondary vents 96, the liquid may either flow back out the vents, be disposed downstream of the divider wall 106, or be disposed upstream of the divider wall 106. Liquid that flows back out the vent or that is disposed downstream of the divider wall 84 should be deterred from flowing into the power conversion chamber 52.

Liquid that is disposed upstream of the divider wall 106 likewise should be deterred from flowing into the fan compartment 74 and subsequently into the power conversion chamber 52. In particular, liquid that flows along the base 90 (or the cover 26 or side walls 32, depending on the orientation of the housing 22) should be deterred from flowing freely into the opening 111 of the flange 104 due to the spacing of the flange walls with respect to the base 90, cover 26, and side walls 32. Accordingly, the liquid should flow to a location between the flange 104 and the proximal housing surface. The flange 104 may also deter liquid that is flowing along the upstream surface of the partition wall 92 from flowing into the aperture 102. The liquid may therefore either remain in the outlet chamber 60 or eventually exit the outlet chamber 60 via one or more of the vents 94 and 96. It should be further appreciated that the outer surfaces of the flange 104, along with the guard plate 106, may provide a splashguard that deters liquid splashing within the outlet chamber 60 from entering the power conversion chamber 52. In particular, the flange side walls 105 may guard the lateral ends of the opening 102, the upper and lower flange walls 107 and 109 may guard the upper and lower ends of the opening 102, and the guard plate 106 may guard the front of the opening 102 regardless of the orientation of the power adapter 20.

While one embodiment has been shown in the figures, it is to be understood that other similar embodiments may be used or modifications and additions may be made to the described embodiment without deviating from the spirit and scope of the subject matter recited in the appended claims. For instance, while a pair of chambers disposed within the power converter 20 have been illustrated, it is also contemplated that a ventilation system 56 may alternatively include a single chamber that provides for the ingress and egress of airflow through the power conversion chamber 52 while restricting the flow of liquid into the power conversion chamber 52. Therefore, the following claims should not be deemed limited to any single embodiment, but rather should be construed in breadth and scope to encompass all such variations and modifications to the disclosed embodiment.

What is claimed:

1. A power converter, comprising:
   a housing;
   a power conversion chamber disposed within the housing, the power conversion chamber containing power circuitry configured to convert input power to an output power;
   a ventilation chamber defining a vent having a vent opening, wherein the vent places the ventilation chamber in fluid communication with an ambient environment, and further defining an aperture that places the ventilation chamber in fluid communication with the power conversion chamber, said aperture being defined by a partition wall that separates the ventilation chamber from the power conversion chamber and said aperture being surrounded by a flange that extends from the partition wall into the ventilation chamber; and
   a guard plate disposed within the ventilation chamber at a location adjacent the aperture and spaced from the housing, such that air can flow between the vent and the power conversion chamber via the aperture, while liquid is deterred from flowing from the vent through the aperture, wherein the vent opening extends through the housing at a location such that the guard plate is disposed between the vent opening and the aperture.

2. The power converter as recited in claim 1, further comprising an air mover configured to move air through the vent and the power conversion chamber.

3. The power converter as recited in claim 1, wherein the flange is spaced from the housing.

4. The power converter as recited in claim 3, wherein the guard plate extends between opposing walls of the housing such that a gap exists between the plate and at least one of the opposing walls of the housing.

5. A power converter, comprising:
a housing;
a power conversion chamber disposed within the housing, the power conversion chamber containing power circuitry configured to convert input power to an output power;
a ventilation intake chamber defining an intake vent having a vent opening, wherein the vent places the intake chamber in fluid communication with an ambient environment, and further defining an intake aperture that allows ambient air to flow from the intake vent, through the ventilation chamber, and into the power conversion chamber, wherein the ventilation intake chamber further includes a first guard plate disposed adjacent the intake aperture and spaced from the housing such that the first guard plate is disposed between the vent opening and the intake aperture; and
a ventilation outlet chamber defining an outlet vent that places the outlet chamber in fluid communication with the ambient environment, and further defining an outlet aperture that allows air to flow from the power conversion chamber, through the outlet vent, wherein the ventilation outlet chamber further includes a second guard plate disposed adjacent the outlet aperture and spaced from the housing.

6. The power converter as recited in claim 5, further comprising an air mover configured to move air from the intake vent to the outlet vent.

7. The power converter as recited in claim 6, wherein the air mover is disposed in the intake chamber.

8. The power converter as recited in claim 7, wherein the intake chamber further comprises a divider wall that defines a fan compartment, and the fan is disposed in the fan compartment.

9. The power converter as recited in claim 8, wherein the intake aperture extends through the divider wall.

10. The power converter as recited in claim 9, wherein the first and second guard plates of the intake and outlet chambers each surround the corresponding intake and outlet apertures and are spaced from the housing.

11. The power converter as recited in claim 9, wherein the first and second guard plates permit air to flow between the respective chamber and the power conversion chamber, and the first and second guard plates deter liquid from flowing from the respective chamber into the power conversion chamber.

12. A power converter, comprising:
a housing;
a power conversion chamber disposed within the housing, the power conversion chamber containing power circuitry configured to convert input power to an output power;
a ventilation intake chamber disposed within the housing, the intake chamber including a wall defining an intake aperture that places the intake chamber in fluid communication with the power conversion chamber, a guard plate extending from the wall and surrounding the intake aperture at a location spaced from the housing, an intake vent formed in the housing that places the intake chamber in fluid communication with an ambient environment, and a divider wall disposed at a location such that the intake aperture is disposed between the divider wall and the power conversion chamber, wherein the divider wall defines a gap with respect to the housing that places the intake aperture in fluid communication with the intake vent;
a ventilation outlet chamber disposed within the housing, the outlet chamber including a wall defining an outlet aperture that places the outlet chamber in fluid communication with the power conversion chamber, a guard plate extending from the outlet chamber wall at a location spaced from the housing such that the guard plate is disposed between an outlet vent opening and the outlet aperture, the outlet vent formed in the housing that places the outlet chamber in fluid communication with the ambient environment, and a divider wall disposed at a location such that the outlet aperture is disposed between the divider wall and the power conversion chamber, wherein the divider wall defines a gap with respect to the housing that places the outlet aperture in fluid communication with the outlet vent; and
an air mover operable to draw ambient air into the intake chamber via the intake vent, circulate the ambient air through the power conversion chamber, and cause the ambient air to flow into the outlet chamber and exit the housing via the outlet vent.

* * * * *